(12) United States Patent
Takamatsu

(10) Patent No.: US 9,666,596 B2
(45) Date of Patent: May 30, 2017

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventor: Tomohiro Takamatsu, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/010,623

(22) Filed: Jan. 29, 2016

(65) Prior Publication Data

US 2017/0062461 A1   Mar. 2, 2017

Related U.S. Application Data

(60) Provisional application No. 62/209,535, filed on Aug. 25, 2015.

(51) Int. Cl.
| | | |
|---|---|---|
| H01L 27/115 | (2006.01) | |
| H01L 49/02 | (2006.01) | |
| H01L 27/11582 | (2017.01) | |
| H01L 27/11573 | (2017.01) | |

(52) U.S. Cl.
CPC .. *H01L 27/11582* (2013.01); *H01L 27/11573* (2013.01); *H01L 28/40* (2013.01)

(58) Field of Classification Search
CPC ........... H01L 21/76802; H01L 23/5226; H01L 27/0733; H01L 27/11573; H01L 28/91

USPC .......................................... 257/298; 438/637
See application file for complete search history.

(56) References Cited

U.S. PATENT DOCUMENTS

| | | | | |
|---|---|---|---|---|
| 2011/0233722 A1* | 9/2011 | Liang | ............... | H01G 4/232 257/532 |
| 2014/0070295 A1 | 3/2014 | Fukuda et al. | | |
| 2014/0284688 A1 | 9/2014 | Hirai et al. | | |

FOREIGN PATENT DOCUMENTS

| | | |
|---|---|---|
| JP | 2014-53447 | 3/2014 |
| JP | 2014-187324 | 10/2014 |

* cited by examiner

*Primary Examiner* — Walter H Swanson
(74) *Attorney, Agent, or Firm* — Oblon, McClelland, Maier & Neustadt, L.L.P.

(57) ABSTRACT

According to one embodiment a semiconductor memory device includes a first stacked body, a pillar, a memory film, a capacitive element, a first wiring, and a second wiring. The capacitive element includes a first conductive member and a second conductive member. A first length of the first conductive member in a first direction is larger than a second length of the first conductive member in a second direction crossing the first direction. A third length of the first conductive member in a third direction crossing the first direction and the second direction is larger than the second length. A fourth length of the second conductive member in the first direction is larger than a fifth length of the second conductive member in the second direction. A sixth length of the second conductive member in the third direction is larger than the fifth length.

13 Claims, 15 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/209,535, filed on Aug. 25, 2015; the entire contents of which are incorporated herein by reference.

FIELD

Embodiments described herein relate generally to a semiconductor memory device and a method for manufacturing the same.

BACKGROUND

In order to achieve high capacity while reducing the bit cost of a semiconductor memory device, it is effective to achieve high integration of memory cells. In recent years, there has been proposed a semiconductor memory device, which has the memory cells three-dimensionally integrated to thereby aim at achieving high integration of the memory cells. In such a three-dimensional lamination semiconductor memory device, there is disposed a capacitive element similarly to a semiconductor memory device having a related-art planar structure. The capacitive element is used for stepping-up a power supply voltage, for example. Alternatively, the capacitive element is used as a protective element.

BRIEF DESCRIPTION OF THE DRAWINGS

FIG. 3 through FIG. 8A are process cross-sectional views illustrating the method of manufacturing the semiconductor memory device according to the first embodiment;

DETAILED DESCRIPTION

According to one embodiment a semiconductor memory device includes a first stacked body including a plurality of conductive layers arranged along a first direction, a pillar extending through the first stacked body in the first direction, a memory film provided between the pillar and the first stacked body, a capacitive element including a first conductive member and a second conductive member, and disposed adjacent to the pillar in a direction intersecting with (i.e., crossing) the first direction, a first wiring electrically connected to the first conductive member, and a second wiring electrically connected to the second conductive member. A first length of the first conductive member in the first direction is larger than a second length of the first conductive member in a second direction intersecting with (i.e., crossing) the first direction. A third length of the first conductive member in a third direction intersecting with (i.e., crossing) the first direction and the second direction is larger than the second length. The first length is larger than a length of the first stacked body in the first direction. A fourth length of the second conductive member in the first direction is larger than a fifth length of the second conductive member in the second direction. A sixth length of the second conductive member in the third direction is larger than the fifth length. The fourth length is larger than a length of the first stacked body in the first direction.

In the specification, the expression "electrically connected" includes not only the case of being directly connected, but also the case of being connected via a conductive member.

(First Embodiment)

Figure 1:
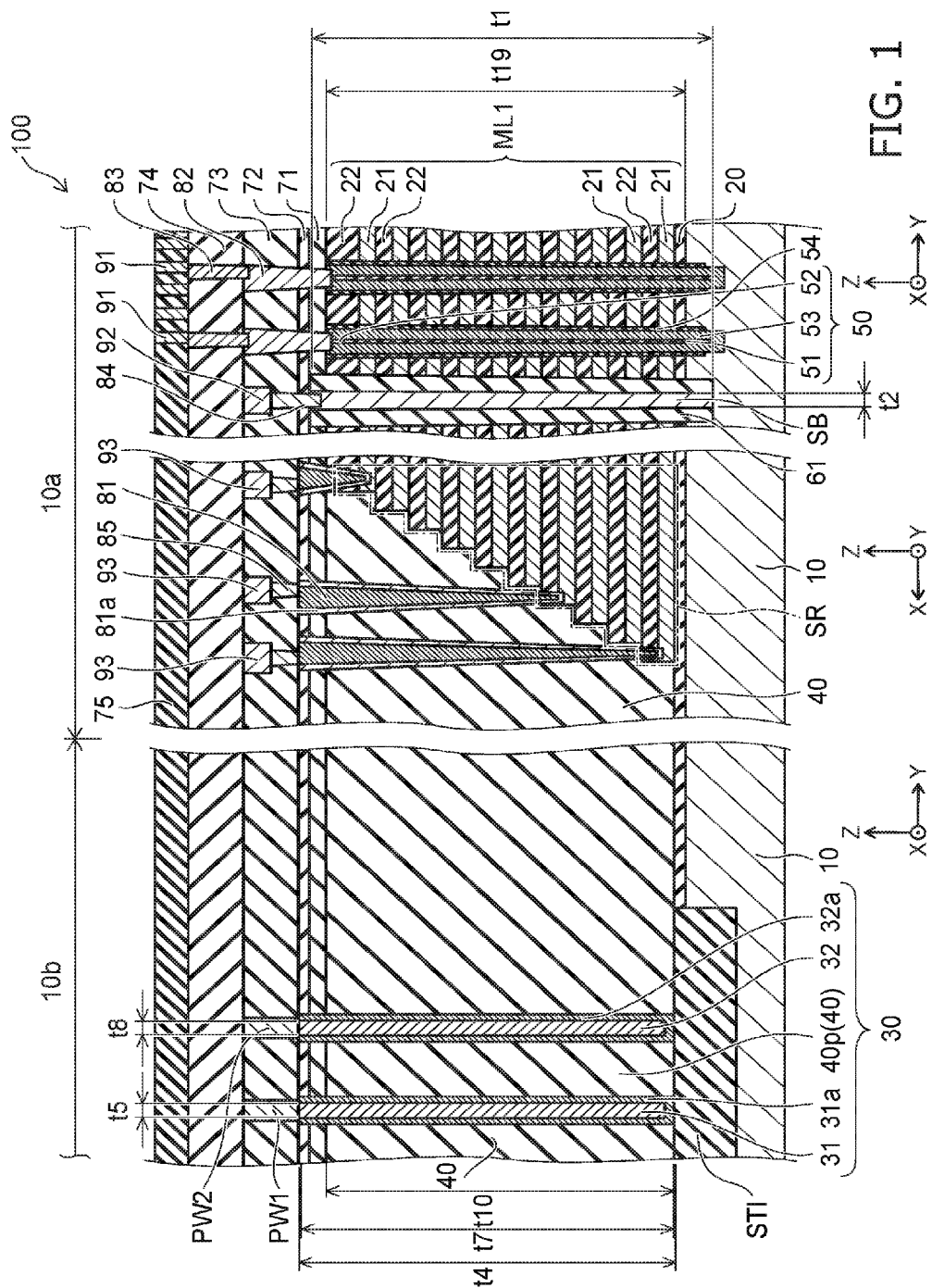
FIG. 1 is a cross-sectional view illustrating a semiconductor memory device according to a first embodiment.

FIG. 1 is a cross-sectional view illustrating a semiconductor memory device according to the embodiment.

Figures 2A, 2B:
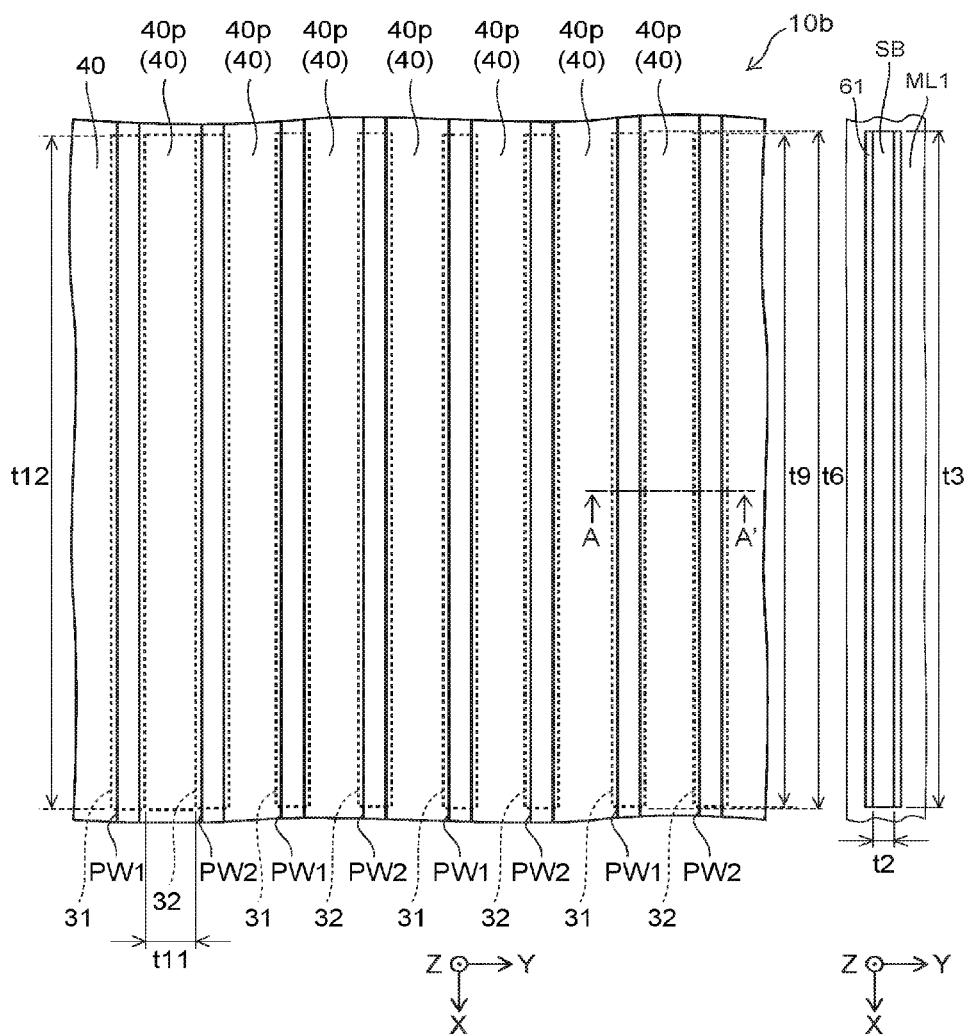
FIG. 2A and FIG. 2B are top views illustrating the semiconductor memory device according to the first embodiment.

FIG. 2A and FIG. 2B are top views illustrating the semiconductor memory device according to the first embodiment.

In FIG. 1, there are shown three different cross-sectional surfaces of a semiconductor memory device 100.

The cross-sectional view illustrating a capacitive element region 10b shown in FIG. 1 corresponds to the cross-section along the line A-A' shown in FIG. 2B.

FIG. 2A is a top view illustrating a shape of a source member SB.

As shown in FIG. 1, the semiconductor memory device 100 according to the embodiment is provided with a substrate 10. To the substrate 10, there are set, for example, a memory cell region 10a and the capacitive element region 10b.

In the memory cell region 10a, on the substrate 10, there are provided pillars 50, memory films 54, a first stacked body ML1, and the source member SB (a third conductive member). In the capacitive element region 10b, on the substrate 10, there are provided capacitive elements 30.

The pillars 50 each extend along a direction perpendicular to a major surface of the substrate 10. A direction in which the pillar 50 extends is defined as a Z-direction (a first direction). One direction perpendicular to the Z-direction is defined as a Y-direction (a second direction). A direction perpendicular to the Z-direction and the Y-direction is defined as an X-direction (a third direction). The pillars 50 are electrically connected to the substrate 10.

As shown in FIG. 1 and FIG. 2A, the source member SB has a plate-like shape extending on the Z-X plane. Specifically, a length t1 of the source member SB in the Z-direction is longer than a length t2 across the source member SB in the Y-direction. A length t3 of the source member SB in the X-direction is longer than the length t2 of the source member SB in the Y-direction. The source member SB is electrically connected to the substrate 10.

FIG. 2A is a top view illustrating the shape of the source member SB. In FIG. 2A, constituents other than the first stacked body ML1, the source member SB, and an insulating film 61 are omitted from the graphical description.

As shown in FIG. 1, the first stacked body ML1 is provided in the periphery of the pillars 50 and the periphery of the source member SB. In other words, the pillars 50 extend in the Z-direction through the first stacked body ML1. The source member SB is provided in the first stacked body ML1. The pillars 50 and the source member SB are electrically connected to each other via the substrate 10. The first stacked body ML1 includes a plurality of conductive layers 21 and a plurality of inter-electrode insulating layers 22. The conductive layers 21 are arranged in the Z-direction so as to be mutually distal. Each of the inter-electrode insulating layers 22 is provided between the conductive layers 21. Between the first stacked body ML1 and the substrate 10, there is provided an interlayer insulating film 20.

Between the first stacked body ML1 and each of the pillars 50, there is provided the memory film 54. The memory film 54 includes, for example, a block insulating film, a charge storage film, and a tunnel insulating film. The block insulating film is provided between the first stacked body ML1 and each of the pillars 50. The tunnel insulating film is provided between the block insulating film and each of the pillars 50. The charge storage film is provided between the tunnel insulating film and the block insulating film.

The block insulating film is a film substantially preventing a current from flowing even in the case in which a voltage is applied within a range of the drive voltage of the semiconductor memory device 100. The charge storage film is a film having a capacity of holding a charge. The tunnel insulating film is a film, which has an insulating property in a normal state, and makes the tunnel current flow when a predetermined voltage within the range of the drive voltage of the semiconductor memory device 100 is applied.

The tunnel insulating film and the block insulating film each include, for example, a silicon oxide. It is also possible for the tunnel insulating film and the block insulating film to include, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, or AlSiO. The charge storage film includes, for example, a silicon nitride.

The pillars 50 each include a core insulating member 51, a diffusion layer 52, and a semiconductor layer 53. The core insulating member 51 has a roughly columnar shape extending in the Z-direction. The diffusion layer 52 is provided on the core insulating member 51. The semiconductor layer 53 is provided between the diffusion layer 52 and the memory film 54, between the core insulating member 51 and the memory film 54, and between the core insulating member 51 and the substrate 10.

Between the source member SB and the first stacked body ML1, there is provided the insulating film 61.

A part of the first stacked body ML1 including the sidewall has a step region SR. In the step region SR, the lengths of the conductive layers 21 in the Y-direction and the lengths of the inter-electrode insulating layers 22 in the Y-direction included in the first stacked body ML1 descend toward the upper layer. Thus, in the step region SR, the first stacked body ML1 has a step-like shape. In the Y-direction, the length of one conductive layer 21 and the length of the inter-electrode insulating layer 22 as a next layer above the one conductive layer 21 are roughly equal to each other. In other words, an upper surface of each of the conductive layers 21 is covered with the inter-electrode insulating layer 22 as a next layer above the conductive layer 21. Further, a part of the upper layer of the inter-electrode insulating layer 22 of the step region SR has a part not covered with the conductive layer 21 as a next layer above the inter-electrode insulating layer 22.

As shown in FIG. 1 and FIG. 2B, the capacitive elements 30 each include a first conductive member 31 and a second conductive member 32. The first conductive member 31 and the second conductive member 32 each have a plate-like shape extending in the Z-X direction. Specifically, a length t4 of the first conductive member 31 in the Z-direction is longer than a length t5 of the first conductive member 31 in the Y-direction. The length t4 of the first conductive member 31 in the Z-direction is longer than a length (t19) of the first stacked body ML1 in the Z-direction. A length t6 of the first conductive member 31 in the X-direction is longer than the length t5 of the first conductive member 31 in the Y-direction. A length t7 of the second conductive member 32 in the Z-direction is longer than a length t8 of the second conductive member in the Y-direction. A length t9 of the second conductive member 32 in the X-direction is longer than the length t8 of the second conductive member 32 in the Y-direction. The length (t4) of the second conductive member 32 in the Z-direction is longer than the length (t19) of the first stacked body ML1 in the Z-direction.

For example, the length t4 of the first conductive member 31 in the Z-direction is 10 or more times longer than the length t5 of the first conductive member 31 in the Y-direction. For example, the length t6 of the first conductive member 31 in the X-direction is 10 or more times longer than the length t5 of the first conductive member 31 in the Y-direction. For example, the length t7 of the second conductive member 32 in the Z-direction is 10 or more times longer than the length t8 of the second conductive member 32 in the Y-direction. For example, the length t9 of the second conductive member 32 in the X-direction is 10 or more times longer than the length t8 of the second conductive member 32 in the Y-direction.

It is favorable for the first conductive member 31 and the second conductive member 32 to be provided along the X-direction in parallel to each other.

The length of the capacitive element 30 in the Z-direction is, for example, 4 μm. The length of the capacitive element 30 in the Z-direction can also be, for example, no less than 3 μm and no more than 6 μm.

Between the capacitive element 30 and the substrate 10, there is provided a device isolation insulating film STI (an insulating section). On the substrate 10, there is provided an insulating layer 40 in the periphery of the first conductive member 31, in the periphery of the second conductive member 32, and in the periphery of the first stacked body ML1. The capacitive elements 30 each include an insulating layer 4p (40) as a part of the insulating layer 40 located between the first conductive member 31 and the second conductive member 32.

A length t10 of the insulating layer 40p in the Z-direction is longer than a length t11 of the insulating layer 40p in the Y-direction. A length t12 of the insulating layer 40p in the X-direction is longer than the length t11 of the insulating layer 40p in the Y-direction.

The capacitive element 30 can also include barrier metal films 31a, 32a. The barrier metal film 31a (a first intermediate film) is provided between the first conductive member 31 and the insulating layer 40 and between the first conductive member and the device isolation insulating film STI. The barrier metal film 32a (a second intermediate film) is provided between the second conductive member 32 and the insulating layer 40 and between the second conductive member 32 and the device isolation insulating film STI.

The first conductive member 31 and the second conductive member 32 each include a conductive material such as tungsten. The barrier metal films 31a, 32a are each a film including metal, and each include, for example, titanium. The barrier metal films 31a, 32a can also be films each including titanium nitride.

The insulating layer 40 is also provided on the step region SR of the first stacked body ML1 in the memory cell region 10a. In the Z-direction, the position of the upper surface of the uppermost layer of the first stacked body ML1 and the position of the upper surface of the insulating layer 40 are roughly equal to each other.

On the insulating layer 40 and the first stacked body ML1, there is provided an insulating film 71. On the insulating film 71, there is provided an insulating film 72. On the insulating film 72, there is provided an insulating film 73. On the insulating film 73, there is provided an insulating film 74. On the insulating film 74, there is provided an insulating film 75.

In the step region SR, on the conductive layers 21, there are respectively provided contact plugs 81 (fourth conductive members). The contact plugs 81 each have, for example, a roughly columnar shape extending in the Z-direction. Each of the contact plugs 81 is electrically connected to corresponding one of the conductive layers 21. The contact plugs 81 each include, for example, a material included in the first conductive member 31 and the second conductive member 32. The contact plugs 81 each include a conductive material such as tungsten. On the periphery of each of the contact plugs 81, there is disposed the insulating layer 40.

Between the contact plug 81 and the insulating layer 40 and between the contact plug 81 and the conductive layer 21, which is electrically connected to this contact plug 81, there is provided a barrier metal film 81a. The barrier metal film 81a is a film including metal, and includes, for example, titanium. The barrier metal film 81a can also be a film including titanium nitride.

On each of the pillars 50, there is provided a plug 82. On the plug 82, there is provided a plug 83. On the plugs 83, there is provided a plurality of bit lines 91 extending in, for example, the X-direction. The diffusion layer 52 of the pillar 50 and one of the bit lines 91 are electrically connected to each other via the plugs 82, 83.

Directly on the source member SB, there is provided a plug 84. On the plug 84, there is provided a source wiring 92. The source member SB and the source wiring 92 are connected to each other via the plug 84.

Directly on the contact plug 81, there is provided a plug 85. On the plug 85, there is disposed a wiring 93 extending in the X-direction. The contact plug 81 and the wiring 93 are connected to each other via the plug 85.

In the capacitive element region 10b, on the first conductive member 31, there is provided a first power supply line PW1 extending in, for example, the X-direction. The first conductive member 31 and the first power supply line PW1 are electrically connected to each other. On the second conductive member 32, there is provided a second power supply line PW2 extending in, for example, the X-direction. The second conductive member 32 and the second power supply line PW2 are electrically connected to each other. To the first power supply line PW1, there is applied the ground potential. To the second power supply line PW2, there is applied a power supply potential of a predetermined level. In other words, the voltage applied to the second power supply line PW2 is higher than the voltage applied to the first power supply line PW1. On this occasion, the insulating layer 40p located between the first conductive member 31 and the second conductive member 32 forms a capacity region.

For example, a voltage VSS is applied to the first power supply line PW1, and a voltage VDD is applied to the second power supply line. The voltage Vss is, for example, the ground voltage, and the voltage VDD is, for example, a power supply voltage.

As each of the first power supply line PW1, the second power supply line PW2, the first conductive member 31, and the second conductive member 32, a plurality of lines or members can also be provided as shown in FIG. 2B. In the Y-direction, the plurality of first power supply lines PW1 and the plurality of second power supply lines PW2 are alternately disposed, for example. The first conductive member 31 is provided directly below each of the first power supply lines PW1. The second conductive member 32 is provided directly below each of the second power supply lines PW2.

In FIG. 2B, the constituents other than the first power supply lines PW1, the second power supply lines PW2, the first conductive members 31, the second conductive member 32, and the insulating layer 40 are omitted from the graphical description.

A method of manufacturing the semiconductor memory device 100 according to the embodiment will be described.

FIG. 3 through FIG. 8A are process cross-sectional views illustrating the method of manufacturing the semiconductor memory device according to the embodiment.

Figure 8A:
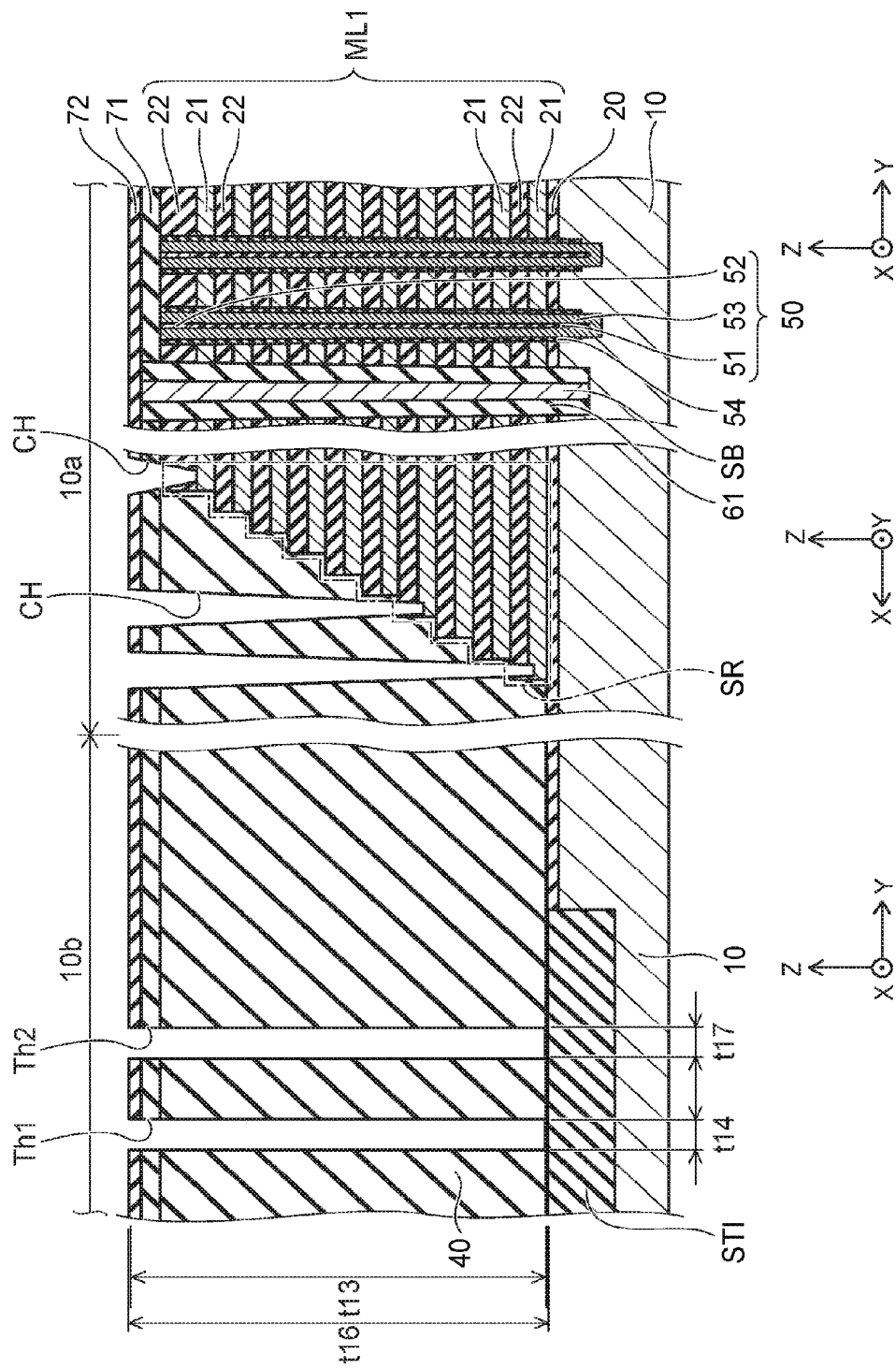
Figure 8B:
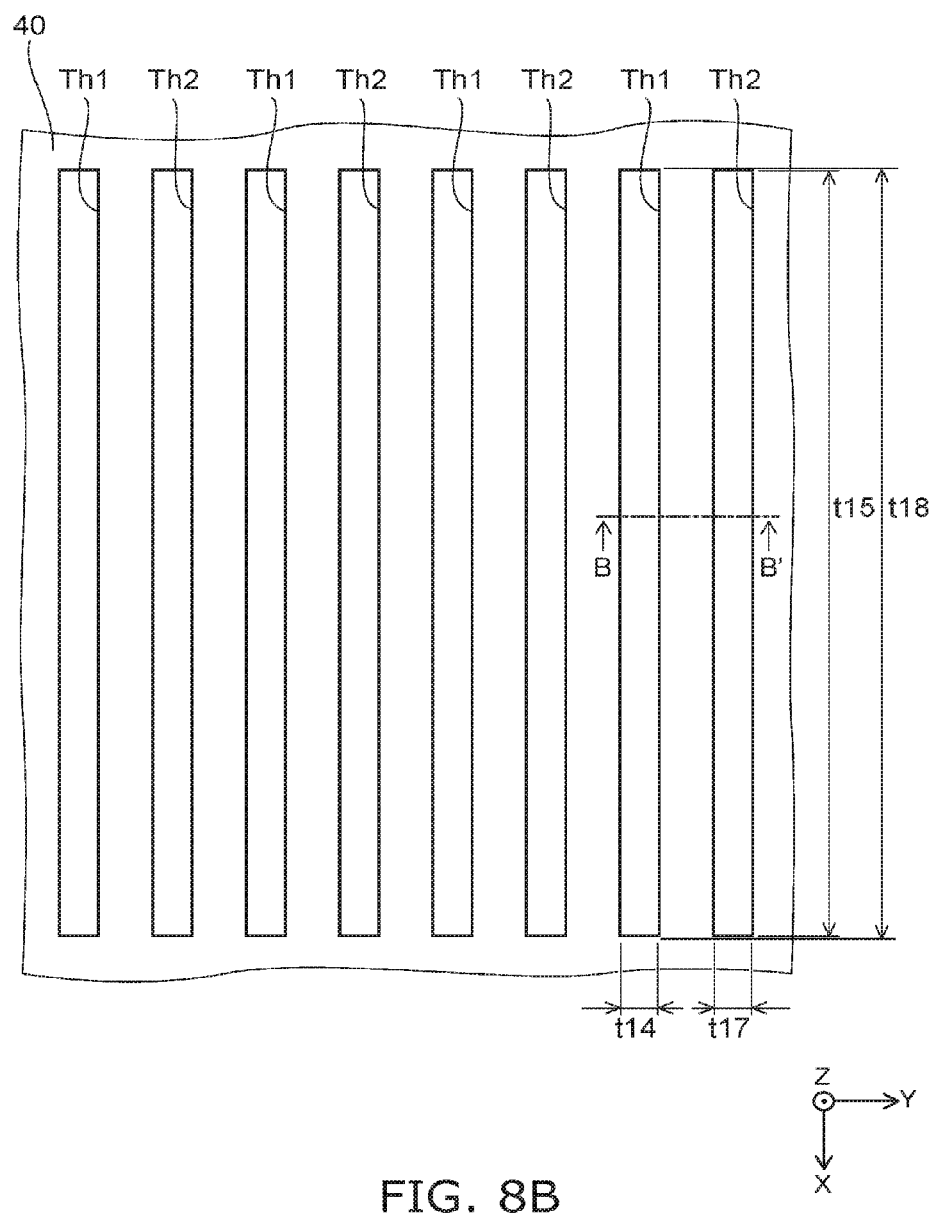
FIG. 8B is a top view illustrating the method of manufacturing the semiconductor memory device according to the first embodiment.

FIG. 8B is a top view illustrating the method of manufacturing the semiconductor memory device according to the embodiment.

Figure 9:
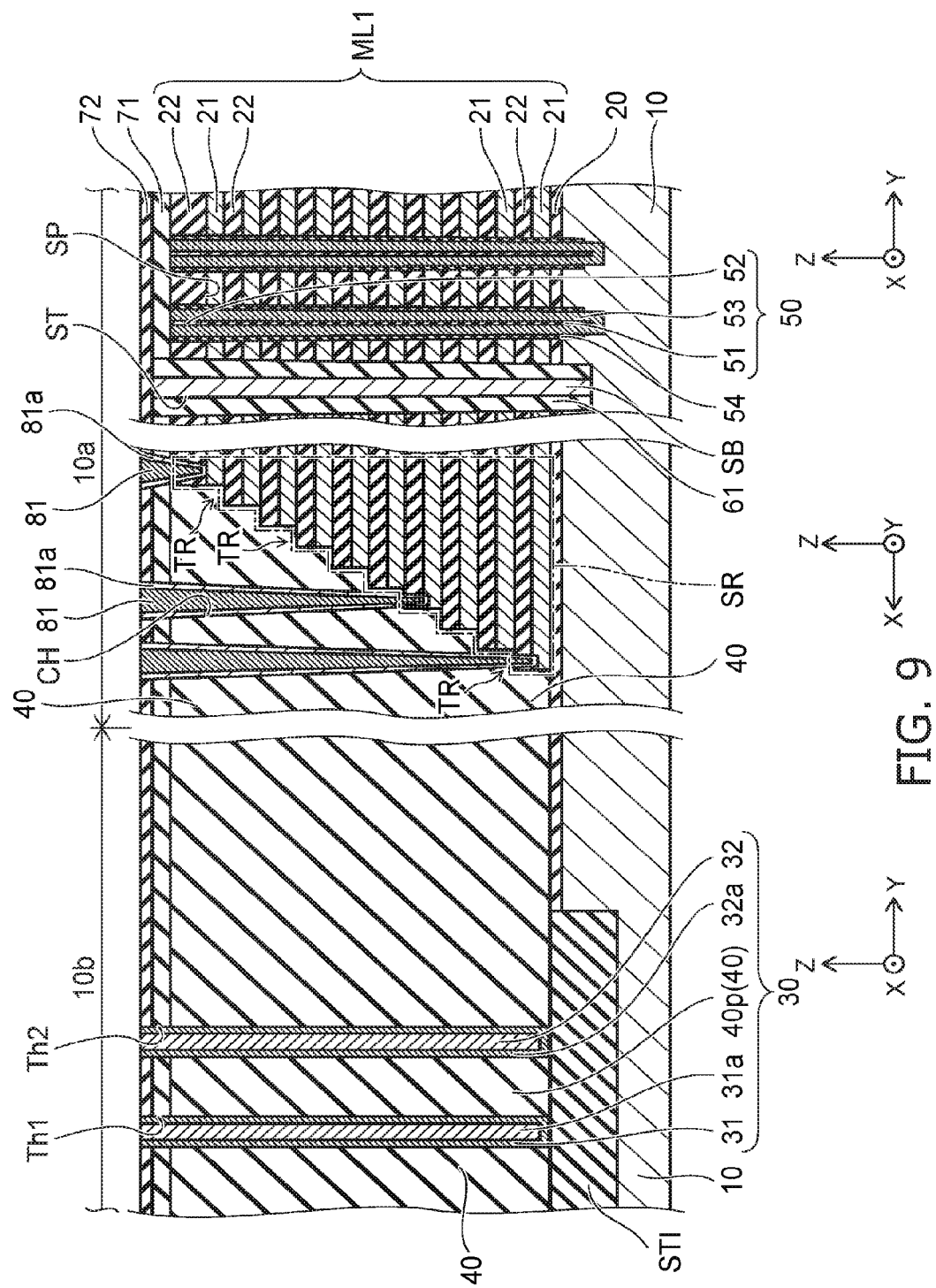
FIG. 9 is a process cross-sectional view illustrating the method of manufacturing the semiconductor memory device according to the first embodiment.

FIG. 9 is a process cross-sectional view illustrating the method of manufacturing the semiconductor memory device according to the embodiment.

In each of FIG. 3 through FIG. 8A, there are shown three different cross-sectional surfaces.

The capacitive element region 10b shown in FIG. 8A corresponds to the cross-sectional surface along the line B-B' shown in FIG. 8B.

In FIG. 9, there are shown three different cross-sectional surfaces.

Figure 3:
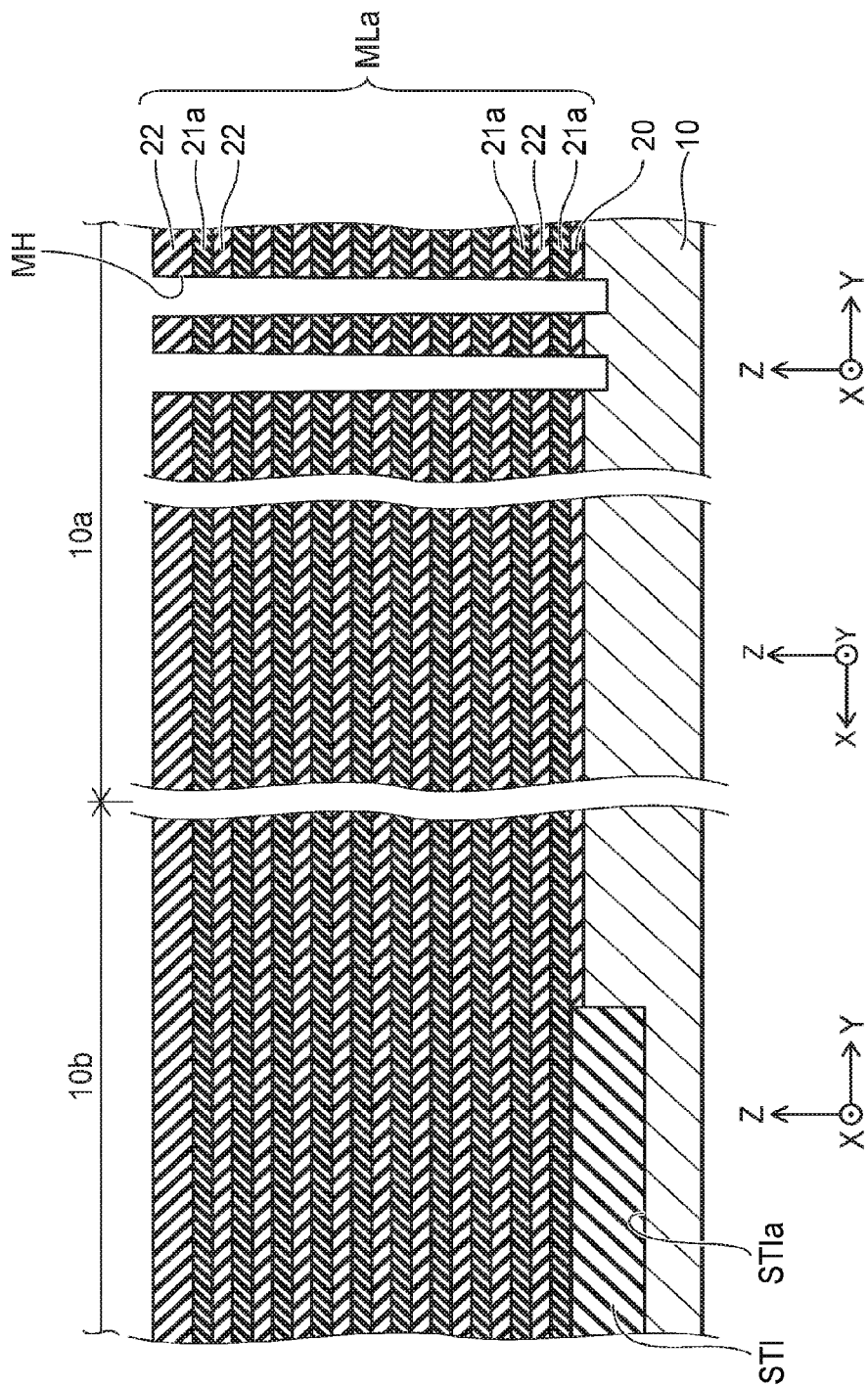

As shown in FIG. 3, the interlayer insulating film 20 is formed on the substrate 10. Subsequently, in the capacitive element region 10b, the interlayer insulating film 20 and an upper layer portion of the substrate 10 are partially removed. Thus, a groove section STIa is formed on the substrate 10. An insulating material is provided in the groove section STIa. Thus, the device isolation insulating film STI is formed in the groove section STIa. A stacked body MLa including a plurality of sacrifice layers 21a (first films) and a plurality of inter-electrode insulating layers 22 is formed on the interlayer insulating film 20 and the device isolation insulating film STI. The stacked body MLa is formed by alternately stacking the sacrifice layers 21a and the inter-electrode insulating layers 22 in the Z-direction.

The interlayer insulating film 20, the device isolation insulating film STI, and the inter-electrode insulating layers 22 are formed using an insulating material including, for example, silicon oxide. The sacrifice layers 21a are formed using, for example, silicon nitride.

Anisotropic etching such as reactive ion etching (RIE) is performed on the stacked body MLa. Thus, memory holes MH are formed in the stacked body MLa in the memory cell region 10a. The memory holes MH are each, for example, a hole having a roughly columnar shape extending in the Z-direction. The memory holes MH reach the substrate 10.

Figure 4:
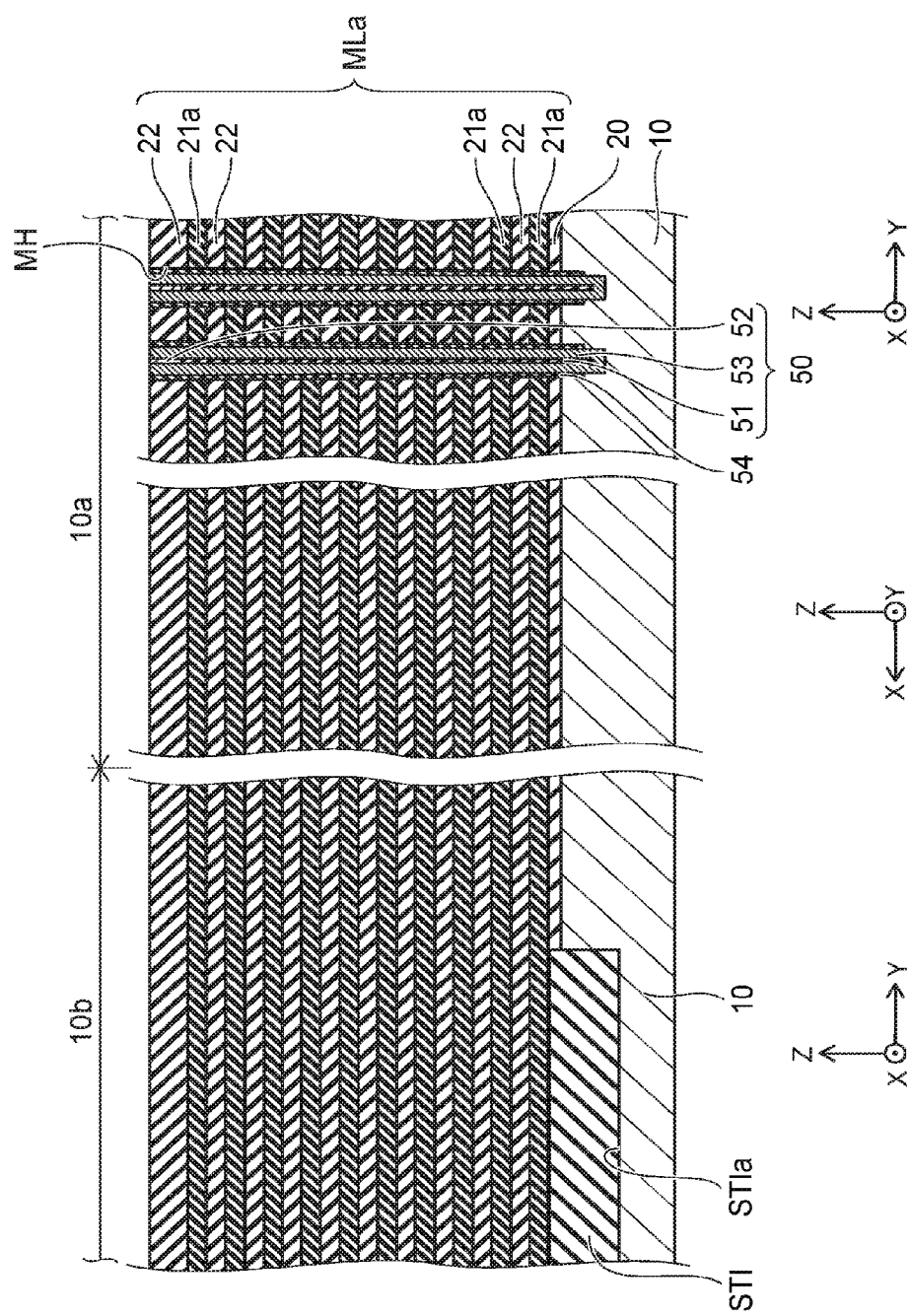

As shown in FIG. 4, the memory film 54 is formed on the inside wall (the sidewall and the bottom portion) of each of the memory holes MH. In each of the memory holes MH, the semiconductor layer 53 is formed inside the memory film 54.

The memory film 54 and the semiconductor layer 53 formed on the bottom portion of each of the memory holes MH are removed by anisotropic etching such as RIE. Thus, a part of the surface of the substrate 10 is exposed in the bottom portion of the memory hole MH. On this occasion, there remain the memory film 54 formed on the sidewall of each of the memory holes MH, and the semiconductor layer 53 formed inside the memory film 54.

Subsequently, the semiconductor layer is formed in each of the memory holes MH. The semiconductor layer forms a part of the semiconductor layer 53. Thus, the semiconductor layer 53 covers the exposed surface of the substrate in each of the memory holes MH. Thus, the semiconductor layer 53 is electrically connected to the substrate 10.

In each of the memory holes MH, the core insulating member 51 is formed inside the semiconductor layer 53. Subsequently, the upper part of the core insulating member 51 is etched back. The diffusion layer 52 is formed in a hollow section formed by the etch back. Thus, the pillar 50 is formed in each of the memory holes MH, and the memory film 54 is formed between the pillar 50 and the stacked body MLa.

The semiconductor layer 53 is formed as, for example, an amorphous silicon layer using amorphous silicon, and is then formed by being modified to a polysilicon layer using an annealing treatment. The core insulating member 51 is formed using an insulating material such as silicon oxide. The diffusion layer 52 is, for example, a doped silicon layer. The impurity concentration of the diffusion layer 52 is higher than the impurity concentration of the semiconductor layer 53.

Figure 5:
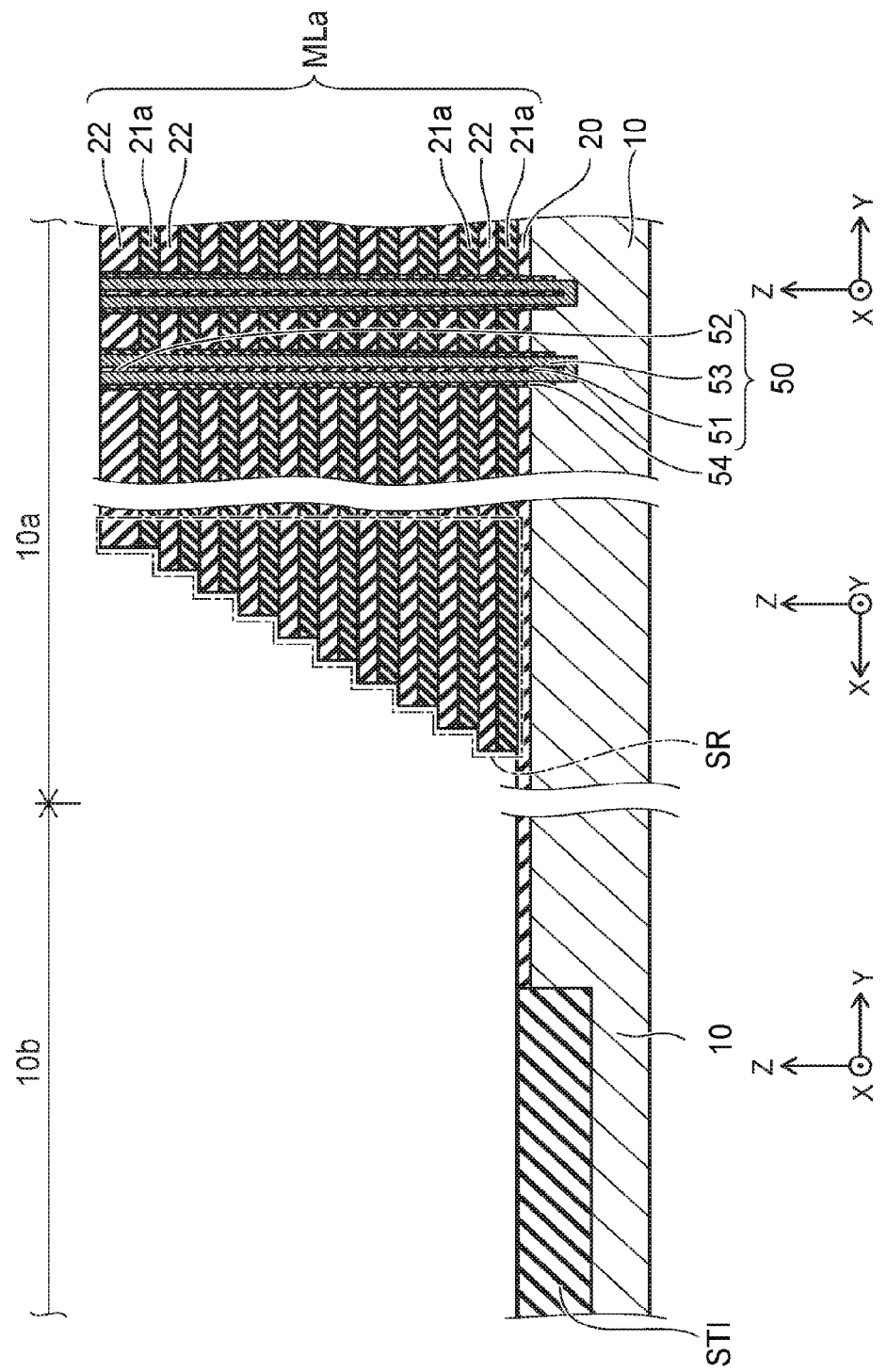

As shown in FIG. 5, the stacked body MLa is provided with the step region SR in an area between the pillar 50 and the capacitive element region 10b. The step region SR is formed by forming a resist film on the stacked body MLa, and then alternately processing the resist film and the stacked body MLa. Specifically, the step region SR is formed by alternately repeating a slimming process for decreasing the length of the resist film in the Y-direction and a process of performing etching on the stacked body MLa. In the process of performing etching on the stacked body MLa, by performing the etching process once, the inter-electrode insulating layers 22 are etched as much as a single layer, and the sacrifice layers 21a are etched as much as a single layer. Thus, in the capacitive element region 10b, the stacked body MLa on the substrate 10 is removed. In the periphery of each of the pillars 50 in the memory cell region 10a, there remains the part of the stacked body MLa protected by the resist film.

Figure 6:
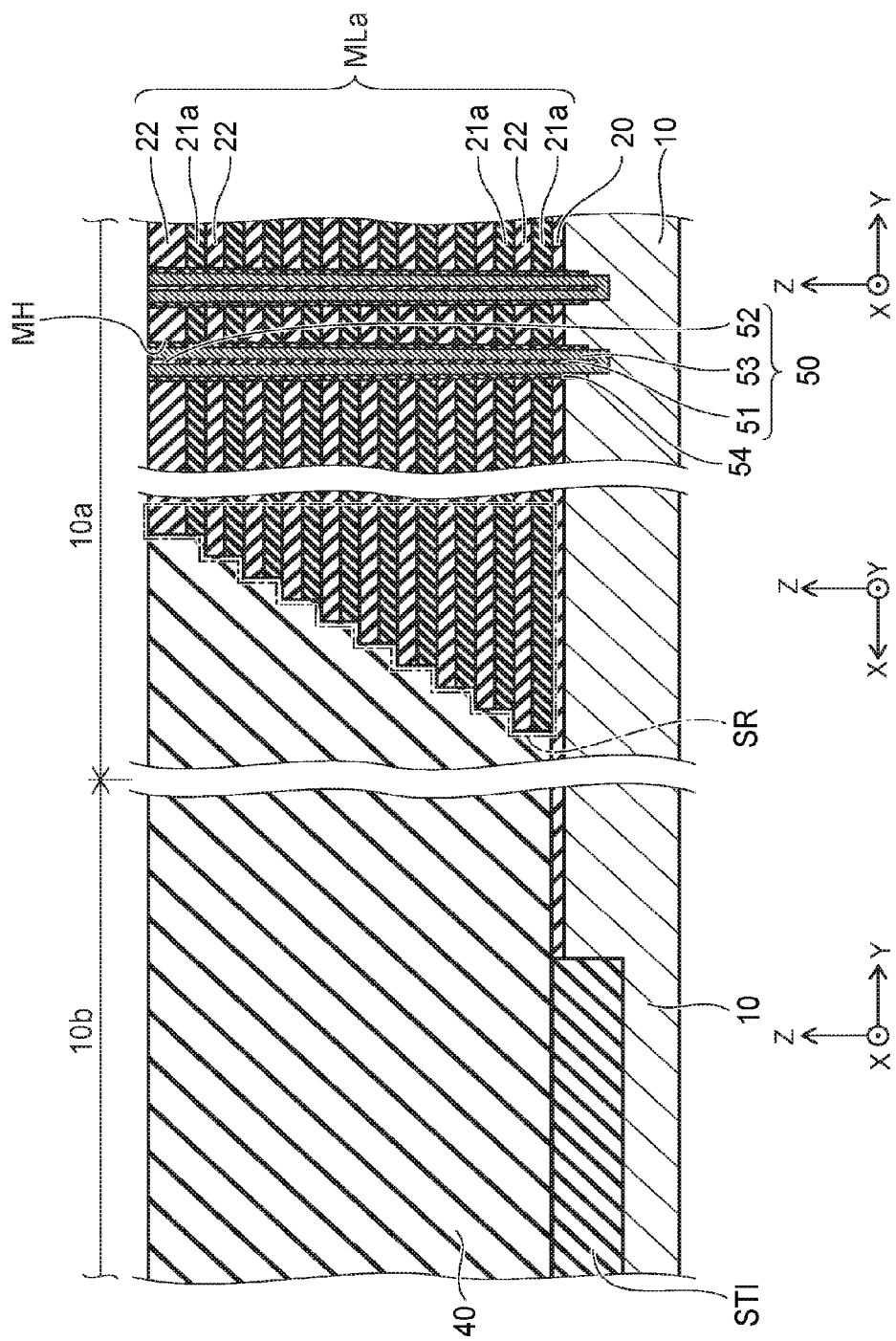

As shown in FIG. 6, the insulating layer 40 is formed on the device isolation insulating film STI, the interlayer insulating film 20, and the step region SR of the stacked body MLa exposed by partially removing the stacked body MLa. Subsequently, a planarization process such as chemical mechanical polishing (CMP) is performed. Thus, the upper surface of the insulating layer 40 is planarized. Thus, the upper surface of the insulating layer 40 and the upper surface of the stacked body MLa are processed so as to be located in roughly the same positions in the X-Y directions.

Figure 7:
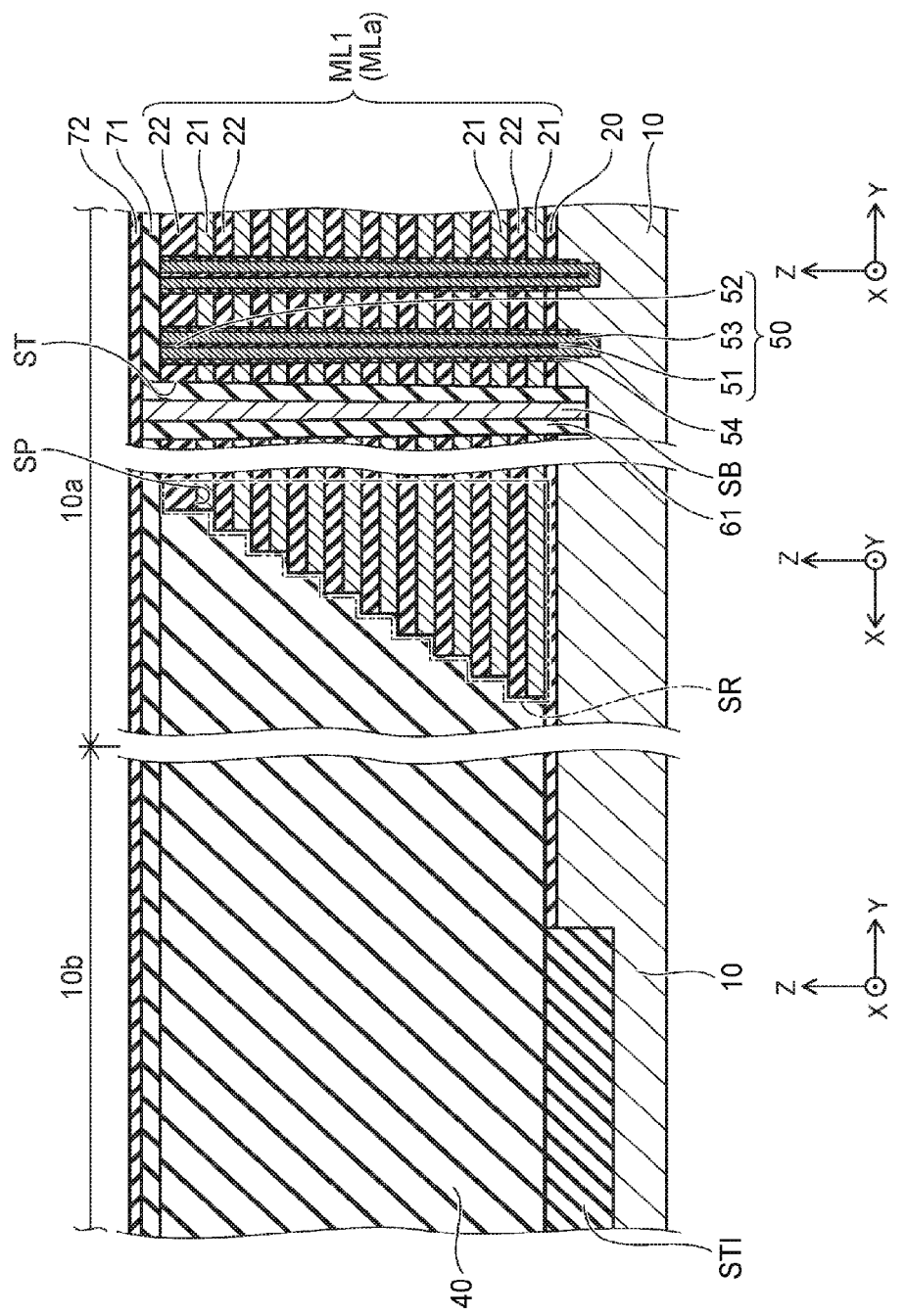

As shown in FIG. 7, the insulating film 71 is formed on the insulating layer 40 and the stacked body MLa. A slit ST penetrating the insulating film 71 and the stacked body MLa is formed. The slit ST is formed at, for example, a place other than the step region SR in the stacked body MLa. The slit ST penetrates the insulating film 71 and the stacked body MLa to reach the substrate 10. The slit ST has, for example, a trench shape extending along the X-Z plane. Therefore, the length of the slit ST in the X-direction is longer than the length of the slit ST in the Y-direction. The length of the slit ST in the Z-direction is longer than the length of the slit ST in the Y-direction.

The sacrifice layers 21a are removed by wet etching via the slit ST. By removing the sacrifice layer 21a, a space SP is formed between the inter-electrode insulating layers 22. The conductive layers 21 are formed in the respective spaces SP via the slit ST. The conductive layers 21 are each a layer including a conductive material, and each include, for example, tungsten.

The insulating film 61 is formed on the sidewall of the slit ST. Subsequently, the slit ST is filled with a conductive material. Thus, the source member SB is formed in the slit ST. The source member SB is electrically connected to the substrate 10. The insulating film 72 is formed on the insulating film 71.

As shown in FIG. 8A, in the capacitive element region 10b, trenches Th1, Th2 penetrating the insulating films 72, 71 and the insulating layer 40 are formed directly on the device isolation insulating film STI. It is also possible to form a plurality of trenches Th1 and a plurality of trenches Th2 in the capacitive element region 10b. The trenches Th1, Th2 reach the device isolation insulating film STI.

As shown in FIG. 8A and FIG. 8B, the trenches Th1, Th2 each have a trench shape extending along the X-Z plane. Therefore, a length t13 of the trench Th1 in the Z-direction is longer than a length t14 of the trench Th1 in the Y-direction. A length t15 of the trench Th1 in the X-direction is longer than the length t14 of the trench Th1 in the Y-direction. A length t16 of the trench Th2 in the Z-direction is longer than a length t17 of the trench Th2 in the Y-direction. A length t18 of the trench Th2 in the X-direction is longer than the length t19 of the trench Th2 in the Y-direction.

In the memory cell region 10a, a plurality of contact holes CH is formed in the insulating layer 40 on the step region SR. The contact holes CH penetrate the respective inter-electrode insulating layers 22 of the step region SR to reach the respective conductive layers 21 as the lower layers of the respective inter-electrode insulating layers 22. The contact holes CH are formed in, for example, terrace regions TR of the respective stages of the step region SR. The contact holes CH are each, for example, a hole having a roughly columnar shape extending in the Z-direction.

In the present embodiment, the trenches Th1, Th2 in the capacitive element region 10b and the contact holes CH in the memory cell region 10a can also be formed in a lump using the anisotropic etching such as RIE.

As shown in FIG. 9, by depositing a barrier metal film, the barrier metal film is formed on each of the inside walls of the trenches Th1, Th2, and the contact holes CH. The barrier metal film formed on the insulating film 72 is removed using, for example, the CMP process. Thus, the barrier metal film 31a is formed on the inside wall of the trench Th1. On the inside wall of the trench Th2, there is formed the barrier metal film 32a. On the inside wall of each of the contact holes CH, there is formed the barrier metal film 81a.

The barrier metal films 31a, 32a, and 81a are formed using a material including, for example, titanium or titanium nitride.

In the trench Th1, the first conductive member 31 is formed inside the barrier metal film 31a. In the trench Th2, the second conductive member 32 is formed inside the barrier metal film 32a. In each of the contact holes CH, the contact plug 81 is formed inside the barrier metal film 81a. On this occasion, it is also possible to form the first conductive member 31, the second conductive member 32, and the contact plugs 81 in a lump using, for example, the same material.

The first conductive member 31, the second conductive member 32, and the contact plugs 81 are formed using a material including, for example, tungsten.

As shown in FIG. 1, the insulating film 73 is formed on the insulating film 72. Directly on each of the pillars 50, there is formed the plug 82 penetrating the insulating films 73, 72, and 71. The plugs 82 and the respective pillars 50 are electrically connected to each other. Directly on the source member SB, there is formed the plug 84. The plug 84 is formed in the insulating films 72, 73. The plug 84 and the source member SB are electrically connected to each other. On the plug 84, there is formed the source wiring 92 extending along, for example, the X-direction. The source wiring 92 is electrically connected to the source member SB via the plug 84. Directly on each of the contact plugs 81, there is formed the plug 85. The plugs 85 are electrically connected to the respective contact plugs 81. The wirings 93 are formed on the respective plugs 85. The wirings 93 are electrically connected to the respective contact plugs 81 via the respective plugs 85.

Directly on the first conductive member 31, there is formed the first power supply line PW1 extending along the X-direction. The first power supply line PW1 is electrically connected to the first conductive member 31. Directly on the second conductive member 32, there is formed the second power supply line PW2 extending along the X-direction. The second power supply line PW2 is electrically connected to the second conductive member 32.

The insulating film 74 is formed on the insulating film 73. Directly on each of the plugs 82, there is formed the plug 83 penetrating the insulating film 74. The insulating film 75 is formed on the insulating film 74. On each of the plugs 83, there is formed the bit line 91 extending along, for example, the X-direction. The bit lines 91 are electrically connected to the pillars 50 via the plugs 83 and the plugs 82, respectively. A plurality of bit lines 91 can also be formed. In this case, between the bit lines 91, there is disposed the insulating film 75.

The semiconductor memory device 100 according to the embodiment is manufactured through the processes described hereinabove.

In the embodiment, the capacitive element 30 extends along the Z-X directions. Thus, in the major surface (the X-Y plane) of the substrate 10, the area occupied by the capacitive element can be decreased while keeping the capacitance of the capacitive element. For example, although described later in detail, the capacitive element 30 in the embodiment increases in capacitance per unit area in the X-Y plane compared to a plane type capacitance element (as in the comparative example described later). Thus, the area of the surface of the substrate occupied by the capacitive element in the semiconductor memory device can be reduced.

In the embodiment, it is also possible to form the contact plugs 81, the first conductive member 31, and the second conductive member 32 in a lump in the same process. In other words, the capacitive element 30 can also be formed at the same time in the process of forming the contact plugs 81. Therefore, the process of providing the semiconductor memory device with the capacitive element can be reduced.

Thus, reduction in the manufacturing cost of the semiconductor memory device becomes possible.

(Reference Example)

Figure 10:
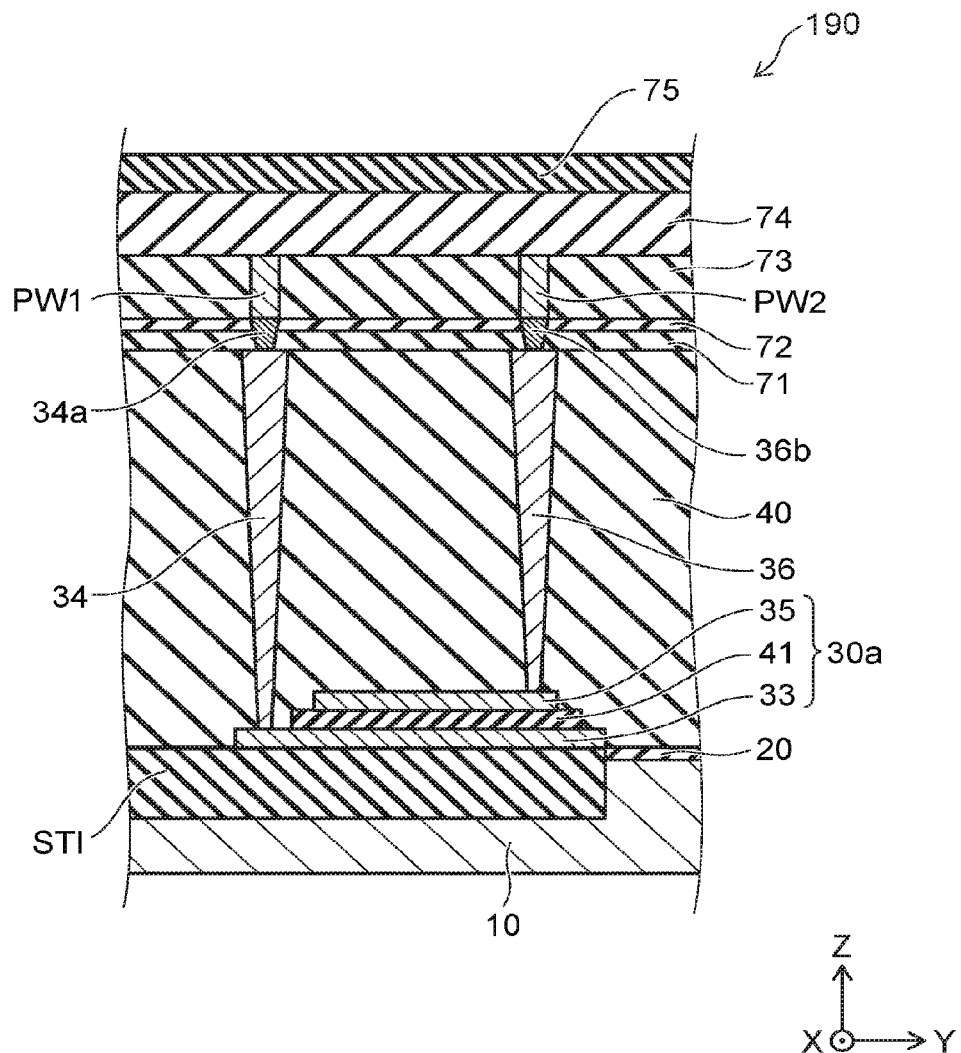
FIG. 10 is a cross-sectional view illustrating a semiconductor memory device according to a reference example of the first embodiment.

FIG. 10 is a cross-sectional view illustrating a semiconductor memory device according to a reference example.

FIG. 10 corresponds to the capacitive element region 10b shown in FIG. 1.

As shown in FIG. 10, in a semiconductor memory device 190 according to the reference example, a capacitive element 30a is provided instead of the capacitive element 30. The capacitive element 30a includes a first conductive film 33, a second conductive film 35, an insulating layer 41, a first contact plug 34, and a second contact plug 36. The first conductive film 33 is provided on the device isolation insulating film STI. On the first conductive film 33, there is provided the second conductive film 35. Between the first conductive film 33 and the second conductive film 35, there is provided the insulating layer 41. The first conductive film 33, the insulating layer 41, and the second conductive film 35 each have a plate-like shape extending along the X-Y plane. In the first conductive film 33, directly on a part where the first conductive film 33 and the second conductive film 35 do not overlap each other in the Z-direction, there is provided the first contact plug 34 extending along the Z-direction. The first contact plug 34 is electrically connected to the first conductive film 33. On the second conductive film 35, there is provided the second contact plug 36 extending along the Z-direction. The second contact plug 36 is electrically connected to the second conductive film. The first contact plug 34 and the second contact plug 36 are each a conductive member having a roughly columnar shape extending along the Z-direction, but are not the conductive members each having the plate-like shape extending along the Z-X plane.

On the first contact plug 34, there is provided a plug 34a. The first contact plug 34 is connected to the first power supply line PW1 via the plug 34a. On the second contact plug 36, there is provided a plug 36a. The second contact plug 36 is connected to the second power supply line PW2 via the plug 36a.

Thus, the insulating layer 41 and the electrode films (the first conductive film 33 and the second conductive film 35) located across from the insulating layer 41 configure the capacitive element 30a.

The length (the thickness) of the insulating layer 41 in the Z-direction is 14 nm.

The other configurations are the same as those of the first embodiment.

(Test Example)

Comparison data between the capacitive element 30 of the semiconductor memory device 100 and the capacitive element 30a of the semiconductor memory device 190 is shown in Table 1. The length of the capacitive element 30 according to the test example in the Z-direction is 4 μm.

TABLE 1

|  | Semiconductor memory device 190 | Semiconductor memory device 100 | | |
| --- | --- | --- | --- | --- |
| Thickness of capacitive oxidation layer (nm) | 14 | 305 | 200 | 100 |
| Ratio of occupation area | 1 | 22 | 14 | 7 |
| Capacitance ratio per unit area | 1 | 184 | 280 | 560 |

In Table 1, the thickness of the capacitive oxidation layer denotes the length (the thickness) of an oxidation layer in the Z-direction in the semiconductor memory device 190. In the semiconductor memory device 100, the thickness of the capacitive oxidation layer denotes the length (the thickness) of the insulating layer 40p in the Y-direction. The ratio of occupation area denotes an area ratio calculated assuming that the area occupied by the capacitive element of the semiconductor memory device 190 in the major surface of the substrate 10 is 1. The capacitance ratio per unit area denotes the capacitance ratio calculated assuming that the capacitance of the capacitive element of the semiconductor memory device 190 per unit area of the major surface of the substrate is 1.

As shown in Table 1, the capacitance per unit area of the capacitive element 30 of the semiconductor memory device 100 is higher than the capacitance per unit area of the capacitive element 30a of the semiconductor memory device 190.

For example, in the capacitive element 30, if the thickness of the insulating layer 40p in the Y-direction is 100 nm, the capacitance ratio per unit area of the capacitive element 30 is 560. In other words, the capacitance per unit area of the capacitive element 30 is 560 times as high as the capacitance per unit area of the capacitive element 30a. On this occasion, the occupation area of the capacitive element 30 is 7 times as large as the occupation area of the capacitive element 30a.

(Variation of First Embodiment)

Figure 11:
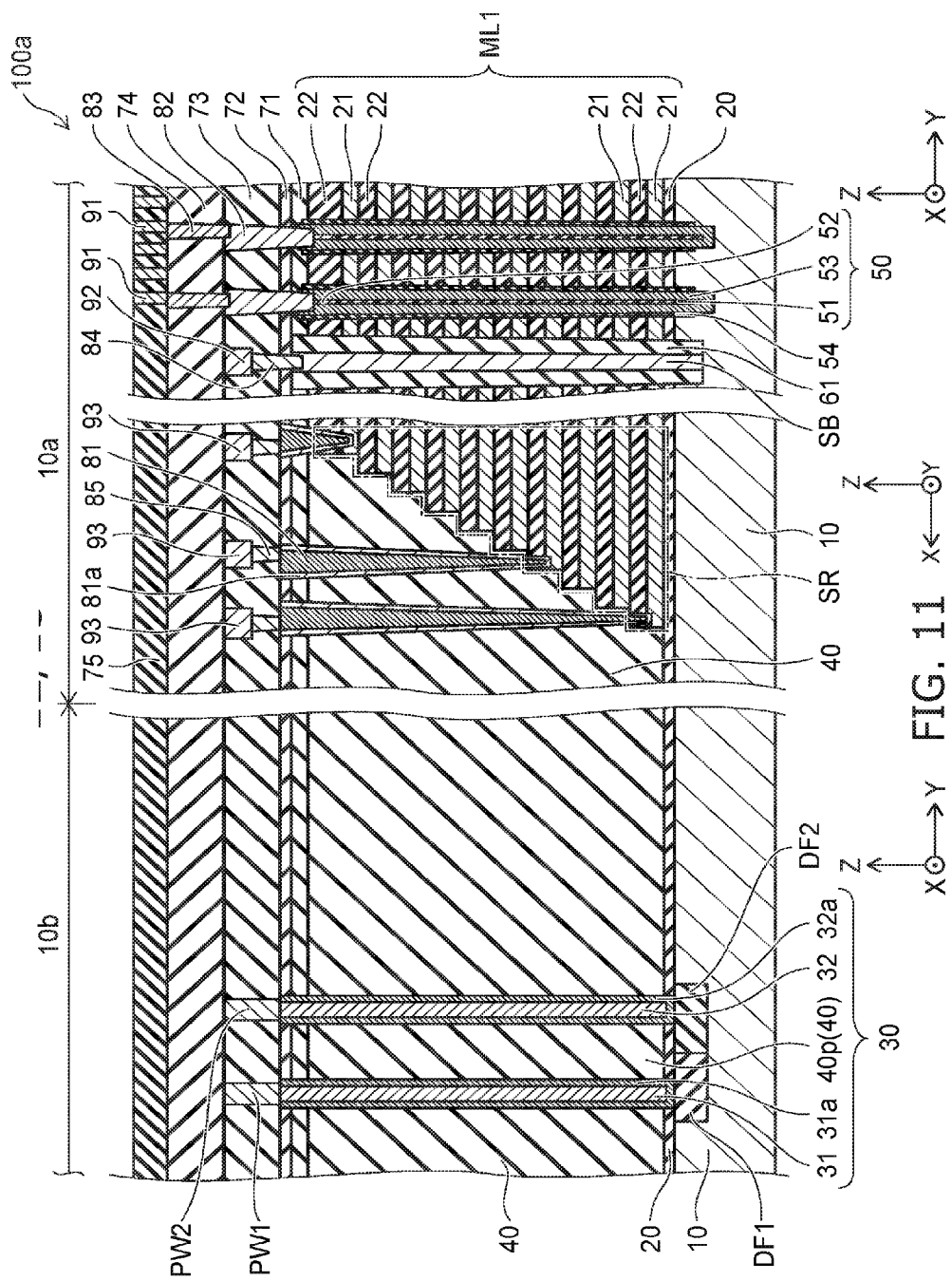
FIG. 11 is a cross-sectional view illustrating a semiconductor memory device according to a variation of the first embodiment.

FIG. 11 is a cross-sectional view illustrating a semiconductor memory device according to the variation.

FIG. 11 shows three different cross-sectional surfaces of a semiconductor memory device 100a.

As shown in FIG. 11, in the semiconductor memory device 100a according to the variation, a first semiconductor region DF1 and a second semiconductor region DF2 are provided between the capacitive element 30 and the substrate 10. Between the capacitive element 30 and the substrate 10, the device isolation insulating film STI is not provided. The first semiconductor region DF1 is provided between the first conductive member 31 and the substrate 10. The first conductive member 31 is connected to the first semiconductor region DF1 via the barrier metal film 31a. The second conductive member 32 is connected to the second semiconductor region DF2 via the barrier metal film 32a. The first semiconductor region DF1 is a diffusion layer with the conductivity type of p-type. The first semiconductor region DF1 includes an impurity such as boron to be an acceptor. The second semiconductor region DF2 is a diffusion layer with the conductivity type of n-type. The second semiconductor region DF2 includes an impurity such as phosphorus to be a donor. The other configurations are the same as those of the first embodiment.

In the method of manufacturing the semiconductor memory device 100a according to the variation, the first semiconductor region DF1 and the second semiconductor region DF2 are formed in the substrate 10 instead of the process of providing the device isolation insulating film STI to the substrate 10 in the first embodiment. Specifically, ion injection is performed on a part of the upper layer of the substrate 10 in the capacitive element region 10b via the interlayer insulating film 20. The impurity such as boron to be the acceptor is injected into the substrate 10. Thus, the first semiconductor region DF1 is formed. The ion injection is performed on the region, which is a part of the upper layer of the substrate 10, and is located adjacent to the first semiconductor region DF1 in the Y-direction, via the interlayer insulating film 20. The impurity such as phosphorous to be the donor is injected into the substrate 10. Thus, the second semiconductor region DF2 is formed. The other processes are the same as those of the first embodiment.

(Second Embodiment)

Figure 12:
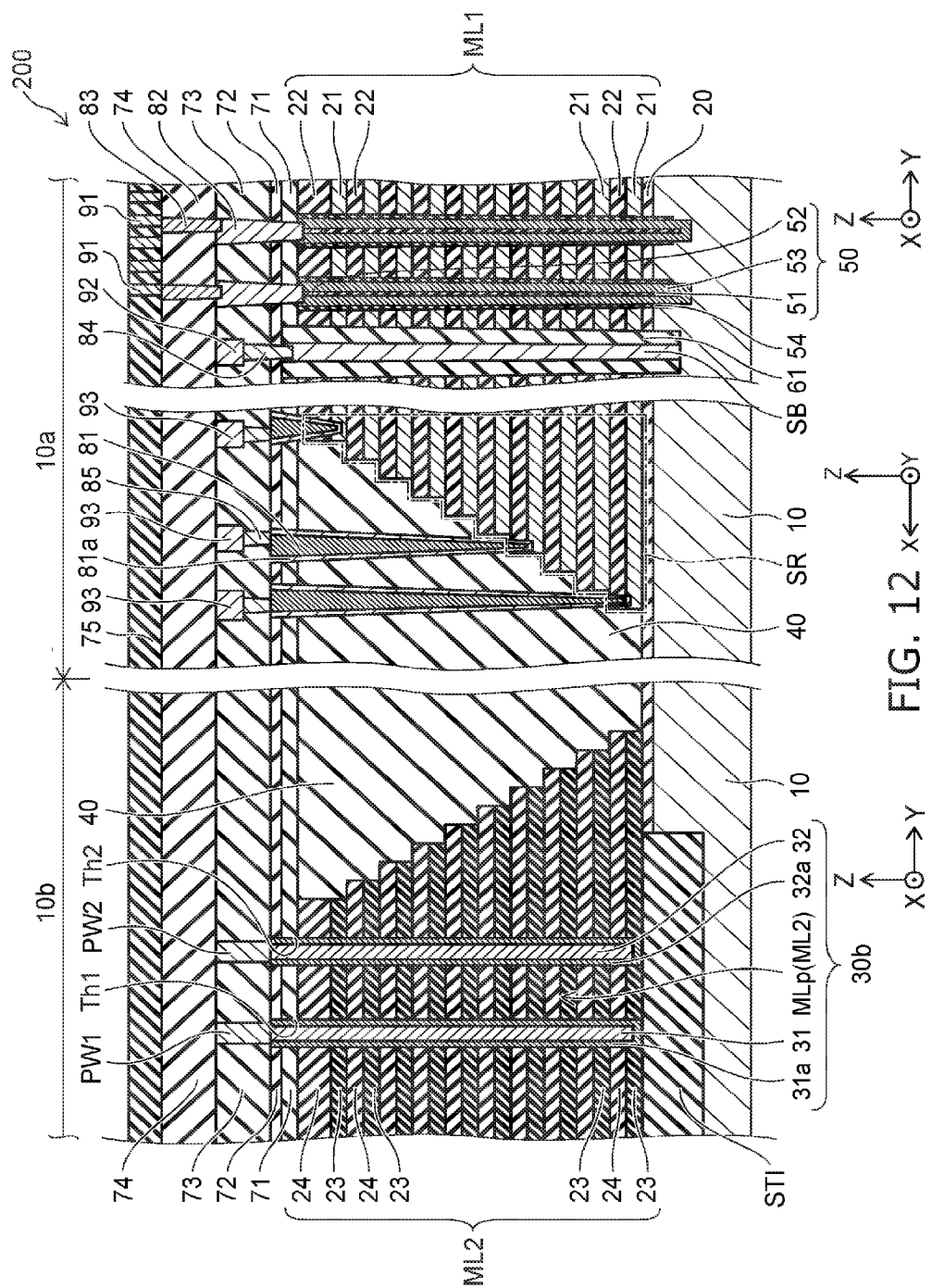
FIG. 12 is a cross-sectional view illustrating a semiconductor memory device according to a second embodiment.

FIG. 12 is a cross-sectional view illustrating a semiconductor memory device according to the embodiment.

In FIG. 12 shows three different cross-sectional surfaces of a semiconductor memory device 200.

In the semiconductor memory device 200 according to the embodiment, a second stacked body ML2 is provided in the periphery of the first conductive member 31 and the second conductive member 32 as shown in FIG. 12. Further, the insulating layer 40 is disposed between the first stacked body ML1 and the second stacked body ML2. The second stacked body ML2 includes a plurality of first insulating layers 23 and a plurality of second insulating layers 24. The first insulating layers 23 are arranged in the Z-direction so as to be spaced from each other. The second insulating layers 24 are provided between the first insulating layers 23, respectively. The barrier metal film 31a is disposed between the first conductive member 31 and the second stacked body ML2. The barrier metal film 32a is disposed between the second conductive member 32 and the second stacked body ML2. A capacitive element 30b of the embodiment includes the first conductive member 31, the barrier metal film 31a, the second conductive member 32, the barrier metal film 32a, and a stacked body MLp, which is a part of the second stacked body ML2 located between the first conductive member 31 and the second conductive member 32.

The other configurations are the same as those of the first embodiment.

Figure 13:
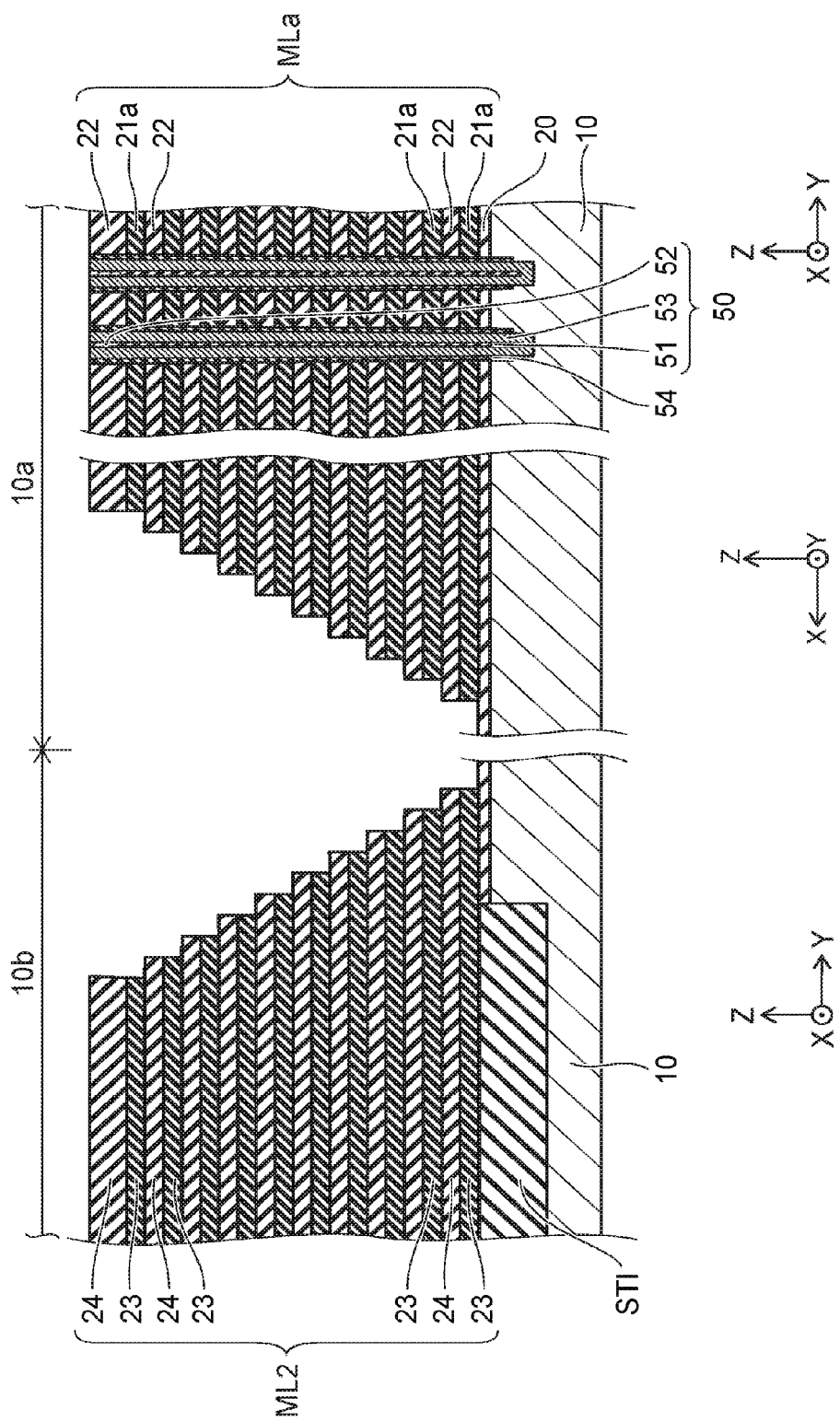
FIG. 13 and FIG. 14 are process cross-sectional views illustrating a part of the method of manufacturing the semiconductor memory device according to the second embodiment.
Figure 14:
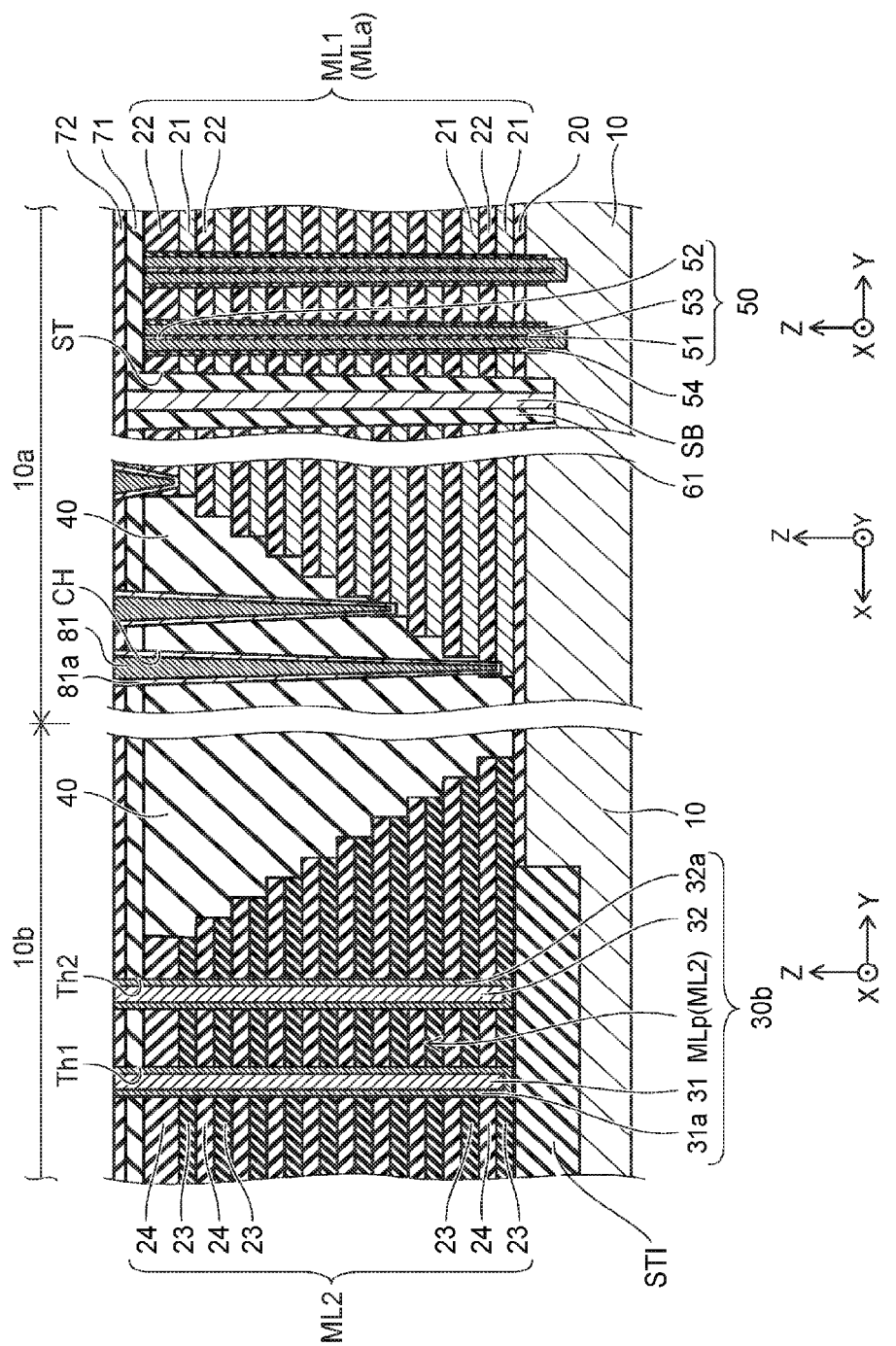

FIG. 13 and FIG. 14 are process cross-sectional views illustrating a part of the method of manufacturing the semiconductor memory device according to the embodiment.

FIG. 13 and FIG. 14 each show three different cross-sectional surfaces.

In the manufacturing process according to the embodiment, the process shown in FIG. 3 and FIG. 4 is performed similarly to the first embodiment. Subsequently, as shown in FIG. 13, in the process of forming the step region SR, a part of the stacked body MLa is made to remain in the capacitive element region 10b.

In other words, a resist film is formed on the stacked body MLa in the memory cell region 10a, and on the stacked body MLa in the capacitive element region 10b. Subsequently, by alternately repeating etching and the slimming process, there is formed the stacked body MLa having the step region SR in the memory cell region 10a. The second stacked body ML2 is formed in the capacitive element region 10b. Thus, in the second stacked body ML2, the plurality of sacrifice layers 21a turn to the plurality of first insulating layers 23, and the plurality of inter-electrode insulating layers 22 turn to the plurality of second insulating layers 24.

As shown in FIG. 14, the insulating layer 40 is formed between the first stacked body ML1 and the second stacked body ML2. The upper surface of the first stacked body ML1, the upper surface of the second stacked body ML2, and the upper surface of the insulating layer 40 are formed at roughly the same positions in the Z-direction.

In the memory cell region 10a, the insulating film 71 is formed on the first stacked body ML1, the second stacked body ML2, and the insulating layer 40. Subsequently, the slit ST penetrating the insulating film 71 and the first stacked body ML1 is formed similarly to the first embodiment. Etching is performed via the slit ST. Thus, the sacrifice layers 21a are removed. On this occasion, the parts from which the sacrifice layers 21a are removed form the spaces SP, respectively. The conductive layers 21 are formed in the respective spaces SP via the slit ST. The insulating film 61 and the source member SB are formed in the slit ST. The insulating film 72 is formed on the insulating film 71.

Subsequently, in an area located in the capacitive element region 10b and on the device isolation insulating film STI, there are formed the trenches Th1 Th2 each penetrating the insulating films 71, 72, the second stacked body ML2, and the interlayer insulating film 20. On this occasion, the contact holes CH each penetrating the insulating layer 40 and one of the inter-electrode insulating layers 22 are formed on the step region SR of the first stacked body ML1 at the same time as the trenches Th1, Th2.

On the inside wall of the trench Th1, there is formed the barrier metal film 31a. On the inside wall of the trench Th2, there is formed the barrier metal film 32a. On the inside wall of each of the contact holes CH, there is formed the barrier metal film 81a. In the trench Th1, the first conductive member 31 is formed inside the barrier metal film 31a. In the trench Th2, the second conductive member 32 is formed inside the barrier metal film 32a. In each of the contact holes CH, the contact plug 81 is formed inside the barrier metal film 81a.

Subsequently, through substantially the same process as in the first embodiment, the semiconductor memory device 200 according to the second embodiment is manufactured.

In the semiconductor memory device 200 according to the embodiment, the first conductive member 31 extending along the Z-X plane, and the second conductive member 32 extending along the Z-X plane are provided similarly to the semiconductor memory device 100 according to the first embodiment. Thus, the capacitance per unit area in the X-Y plane of the capacitive element 30b increases.

In the manufacturing method according to the embodiment, the capacitive element 30 can also be formed at the same time in the process of forming the contact plug 81 similarly to the manufacturing method according to the first embodiment. Thus, reduction in the manufacturing cost of the semiconductor memory device becomes possible.

According to the embodiments described hereinabove, it is possible to realize the semiconductor memory device in which the occupation area of the capacitive element is reduced, and the method of manufacturing the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a first stacked body including a plurality of conductive layers arranged along a first direction;
a pillar extending through the first stacked body in the first direction;
a memory film provided between the pillar and the first stacked body;
a capacitive element including a first conductive member and a second conductive member, and the capacitive element being arranged in a line with the pillar in a direction crossing the first direction;
a first wiring electrically connected to the first conductive member; and
a second wiring electrically connected to the second conductive member,
a first length of the first conductive member in the first direction being longer than a second length of the first conductive member in a second direction crossing the first direction, a third length of the first conductive member in a third direction being longer than the second length, and the first length being longer than a length between a top layer of the conductive layers of the first stacked body and a bottom layer of the conductive layers of the first stacked body in the first direction, the third direction crossing the first direction and the second direction, and
a fourth length of the second conductive member in the first direction being longer than a fifth length of the second conductive member in the second direction, a sixth length of the second conductive member in the third direction being longer than the fifth length, and the fourth length being longer than a length of the first stacked body in the first direction.

2. The device according to claim 1, further comprising:
a third conductive member provided in the first stacked body, and the third conductive member electrically connected to the pillar,
wherein a seventh length of the third conductive member in the first direction is longer than an eighth length of the third conductive member in the second direction, and a ninth length of the third conductive member in the third direction is longer than the eighth length.

3. The device according to claim 1, wherein
the first wiring is a first power supply line,
the second wiring is a second power supply line, and
a potential of the second wiring is higher than a potential of the first wiring.

4. The device according to claim 1, further comprising:
a fourth conductive member connected to one of the conductive layers, and extending in the first direction,
wherein the fourth conductive member includes a material included in the first conductive member and the second conductive member.

5. The device according to claim 1, wherein
a part of the first stacked body is located between the capacitive element and the pillar.

6. The device according to claim 1, further comprising:
an insulating layer provided in a periphery of the first conductive member and a periphery of the second conductive member,
wherein a part of the insulating layer is provided between the first conductive member and the second conductive member.

7. The device according to claim 6, further comprising:
a first intermediate film provided between the first conductive member and the insulating layer; and
a second intermediate film provided between the second conductive member and the insulating layer.

8. The device according to claim 6, wherein
a tenth length of the insulating layer in the first direction between the first conductive member and the second conductive member is longer than an eleventh length of the insulating layer in the second direction between the first conductive member and the second conductive member, and a twelfth length of the insulating layer in the third direction between the first conductive member and the second conductive member is longer than the eleventh length in the second direction between the first conductive member and the second conductive member.

9. The device according to claim 1, further comprising:
a substrate; and
an insulating section,
wherein the first stacked body, the pillar, and the capacitive element are disposed on the substrate, and
the insulating section is disposed between the substrate and the capacitive element.

10. The device according to claim 1, further comprising:
a substrate including
a first semiconductor region having a first conductivity type, and electrically connected to the first conductive member, and
a second semiconductor region having a second conductivity type, and electrically connected to the second conductive member.

11. The device according to claim 1, further comprising:
a second stacked body provided in a periphery of the first conductive member and a periphery of the second conductive member,
wherein the second stacked body includes:
a plurality of first insulating layers arranged along the first direction so as to be spaced from each other, and
a plurality of second insulating layers respectively provided between the first insulating layers.

12. The device according to claim 11, wherein
the first insulating layers include silicon nitride, and
the second insulating layers include silicon oxide.

13. The device according to claim 11, further comprising:
a first intermediate film provided between the first conductive member and the second stacked body; and
a second intermediate film provided between the second conductive member and the second stacked body.

* * * * *